United States Patent
Furue et al.

(10) Patent No.: US 7,745,980 B2
(45) Date of Patent: Jun. 29, 2010

(54) PIEZOELECTRIC RESONANT ELEMENT AND PIEZOELECTRIC RESONATOR USING THE SAME

(75) Inventors: Junji Furue, Kirishima (JP); Masato Murahashi, Kirishima (JP); Yuuji Hata, Kirishima (JP)

(73) Assignee: Kyocera Corporation, Kyoto (JP)

( * ) Notice: Subject to any disclaimer, the term of this patent is extended or adjusted under 35 U.S.C. 154(b) by 320 days.

(21) Appl. No.: 12/064,951

(22) PCT Filed: Aug. 30, 2005

(86) PCT No.: PCT/JP2005/015786

§ 371 (c)(1),
(2), (4) Date: Feb. 26, 2008

(87) PCT Pub. No.: WO2007/026397

PCT Pub. Date: Mar. 8, 2007

(65) Prior Publication Data

US 2009/0152997 A1 Jun. 18, 2009

(51) Int. Cl.
*H01L 41/08* (2006.01)
(52) U.S. Cl. .................................................. 310/365
(58) Field of Classification Search ................. 310/365, 310/366
See application file for complete search history.

(56) References Cited

U.S. PATENT DOCUMENTS

| 4,468,582 A | * | 8/1984 | Fujiwara et al. ............. 310/312 |
| 5,032,755 A | * | 7/1991 | Witte ......................... 310/312 |
| 6,232,699 B1 | | 5/2001 | Wajima ...................... 310/320 |
| 7,626,317 B2 | * | 12/2009 | Nakai et al. ................. 310/365 |
| 7,649,306 B2 | * | 1/2010 | Nakai ......................... 310/365 |
| 2002/0030420 A1 | * | 3/2002 | Tsukai et al. ............... 310/320 |
| 2004/0036383 A1 | * | 2/2004 | Rubach ...................... 310/365 |
| 2009/0200900 A1 | * | 8/2009 | Nakai et al. ................. 310/365 |

FOREIGN PATENT DOCUMENTS

| JP | 51-027736 | 7/1976 |
| JP | 04-088113 | 7/1992 |
| JP | 2000-134060 | 5/2000 |
| JP | 2004-228674 | 8/2004 |

* cited by examiner

*Primary Examiner*—Mark Budd
(74) *Attorney, Agent, or Firm*—Hogan Lovells US LLP

(57) ABSTRACT

There is provided a piezoelectric resonant element having excellent electrical characteristics in which spurious is suppressed. The piezoelectric resonant element (10) is constituted by sticking a pair of oscillatory electrodes (12, 13), respectively, to both major surfaces of a rectangular piezoelectric substrate (11). In the nonopposing regions of both the oscillatory electrodes (12, 13), extending portions (12c, 13c) are provided to extend in the opposite directions outward from the center X of the opposing region.

6 Claims, 10 Drawing Sheets

PIEZOELECTRIC RESONANT ELEMENT AND PIEZOELECTRIC RESONATOR USING THE SAME

CROSS-REFERENCE TO THE RELATED APPLICATIONS

This application is a national stage of international application No. PCT/JP2005/015786 filed Aug. 30, 2005, the entire contents of which are incorporated herein by reference.

TECHNICAL FIELD

The present invention relates to a piezoelectric resonant element widely used for oscillating circuits, filter circuits and the like, and a piezoelectric resonator using the same, and in particular, to a piezoelectric resonant element whose electrical characteristics are improved by suppressing spurious and a piezoelectric resonator using the same.

BACKGROUND ART

Piezoelectric resonant elements utilizing thickness-longitudinal vibrations of piezoelectric bodies, thickness sliding vibrations, and so on have high Q values as resonators, and are widely used for oscillating circuits, filter circuits, and so on.

The piezoelectric resonant elements have a large number of resonant peaks having different frequencies based on vibration modes different in their electrical characteristics.

When piezoelectric resonant elements in which spuriouses (frequency responses due to vibrations other than desired vibrations) are not suppressed are used for oscillating circuits, oscillatory frequencies are liable to be shifted into frequencies at which spuriouses exist against the intentions. On the other hand, when the piezoelectric resonant elements are used for filter circuits, out-of-band attenuations are liable to be insufficient.

Accordingly, in the piezoelectric resonant elements, the point of improving electrical characteristics is how to suppress spuriouses. Therefore, various considerations have been conventionally made.

As conventional piezoelectric resonant elements devised for suppression of spuriouses, one having a configuration shown in FIG. 13 has been known, for example.

A piezoelectric resonant element 101 has a piezoelectric substrate 102 polarized in a thickness direction (corresponding to a direction perpendicular to the paper surface), has circular oscillatory electrodes 103 and 104 formed at central parts on upper and lower surfaces of the piezoelectric substrate 102 (FIG. 13 shows the upper surface) such that they are opposed to each other with the piezoelectric substrate 102 sandwiched therebetween, and utilizes a third harmonic wave of thickness-longitudinal vibration. Furthermore, in the above-mentioned piezoelectric resonant element 101, the diameter of the oscillatory electrode 103 on the upper surface and the diameter of the oscillatory electrode 104 on the lower surface are made to differ from each other. This causes a fundamental wave of thickness-longitudinal vibration to leak out to thereby suppress spurious caused by the vibration.

[Patent document 1] Japanese Unexamined Patent Publication No. 2000-134060

DISCLOSURE OF THE INVENTION

Problems to be Solved by the Invention

In the above-mentioned conventional piezoelectric resonant element 101, however, the fundamental wave of thickness-longitudinal vibration can be only suppressed.

In the case of the piezoelectric resonant element utilizing the third harmonic wave of thickness-longitudinal vibration, for example, higher harmonics such as a fifth harmonic wave of thickness-longitudinal vibration and vibrations other than the thickness-longitudinal vibration also cause spuriouses. In the above-mentioned conventional piezoelectric resonant element 101, however, the spuriouses caused by these vibrations cannot be suppressed.

An object of the present invention is to provide a piezoelectric resonant element capable of effectively suppressing a plurality of spuriouses and a piezoelectric resonator using the same.

Means for Solving the Problems

A piezoelectric resonant element according to the present invention is a piezoelectric resonant element having a pair of oscillatory electrodes stuck to both major surfaces of a rectangular piezoelectric substrate, in which the pair of oscillatory electrodes includes opposing portions that are opposed to each other through the piezoelectric substrate, deriving portions that are derived from the opposing portions in directions parallel to one side surface of the piezoelectric substrate and opposite to each other, and extending portions that are extended in directions perpendicular to the one side surface and opposite to each other.

According to the configuration, in a nonopposing region between the pair of oscillatory electrodes, the extending portions that are extended in the directions opposite to each other and perpendicular to the directions in which the deriving portions in the oscillatory electrodes are derived are formed integrally with the oscillatory electrodes. Therefore, spurious caused by other oscillatory mode created at a frequency in the vicinity of a resonant peak caused by a third harmonic wave of thickness-longitudinal vibration and spurious caused by a higher-order thickness-longitudinal vibration mode and particularly a fifth harmonic wave of thickness-longitudinal vibration can be effectively suppressed.

It is preferable that in the piezoelectric resonant element according to the present invention, one of the extending portions in the pair of oscillatory electrodes and the other extending portion are linearly symmetrical with respect to a straight line passing through the respective centers of the opposing portions and parallel to the one side surface when the piezoelectric substrate is viewed from the top. This configuration allows the adverse effect on the third harmonic wave of thickness-longitudinal vibration to be more effectively suppressed.

A piezoelectric resonator according to the present invention includes the above-mentioned piezoelectric resonant element and a capacitor element electrically connected to the oscillatory electrodes in the piezoelectric resonant element. According to the piezoelectric resonator, the capacitor element is connected to the oscillatory electrodes in the piezoelectric resonant element, so that the spurious is effectively suppressed in its electrical characteristics. As a result, there can be provided the piezoelectric resonator which has excellent characteristics and in which an oscillatory frequency is not easily shifted.

The above-mentioned or other advantages, features, and effects of the present invention will become more apparent from the following description of preferred embodiments of the present invention with reference to the attached drawings.

Figure 1:
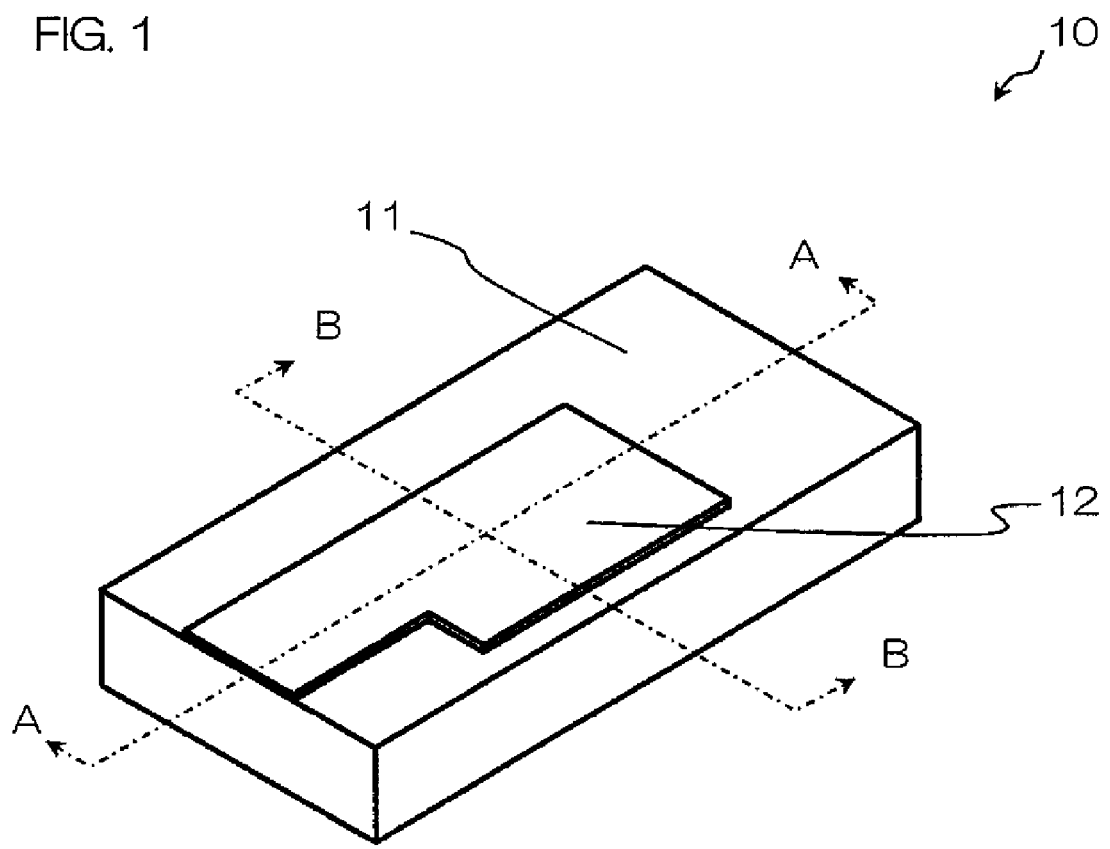
FIG. 1 is a perspective view schematically showing a piezoelectric resonant element according to an embodiment of the present invention.

EXPLANATION OF REFERENCE NUMERALS 1 piezoelectric resonator
10 piezoelectric resonant element
11 piezoelectric substrate
12, 13 oscillatory electrode
12a, 13a opposing portion
12b, 13b deriving portion
12c, 13c extending portion
20 capacitor element
21 dielectric substrate
22a, 22b internal electrode
23a, 23b, 23c external terminal electrode
31a, 31b sealing substrate
41a, 41b frame
51a, 51b oscillatory space

BEST MODE FOR CARRYING OUT THE INVENTION

A piezoelectric resonant element according to the present invention will be now described on the basis of the attached drawings.

Figure 2A:
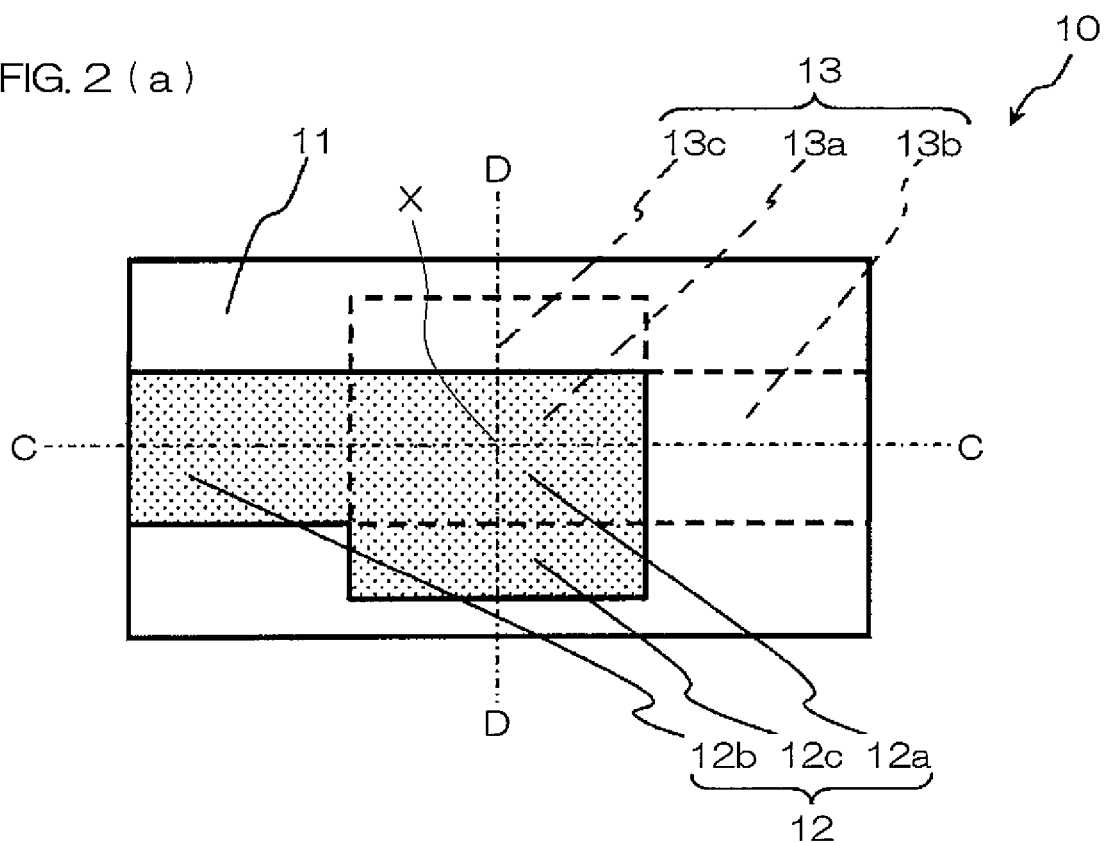
FIG. 2 is diagrams of the piezoelectric resonant element shown in FIG. 1, where FIG. 2 (a) is a plan view of the piezoelectric resonant element shown in FIG. 1 as viewed from the top, FIG. 2 (b) is a sectional view taken along a line A-A shown in FIG. 1, and FIG. 2 (c) is a sectional view taken along a line B-B shown in FIG. 1.
Figure 2B:
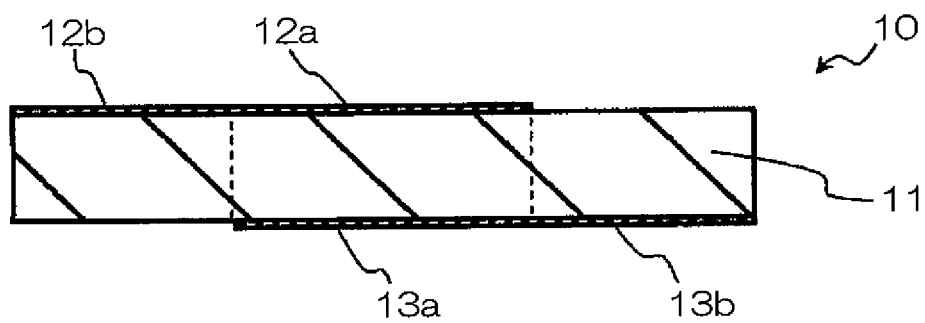
Figure 2C:
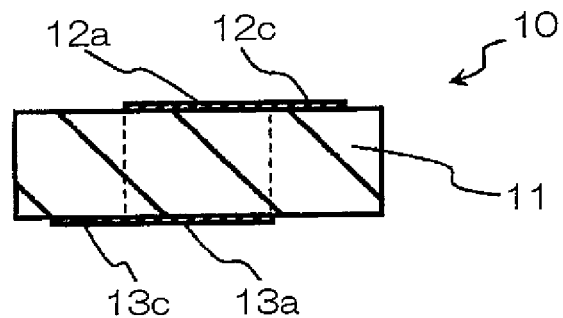

FIG. 1 is a perspective view schematically showing a piezoelectric resonant element according to an embodiment of the present invention. FIG. 2 (a) is a plan view of the piezoelectric resonant element shown in FIG. 1 as viewed from the top, FIG. 2 (b) is a sectional view taken along a line A-A shown in FIG. 1, and FIG. 2 (c) is a sectional view taken along a line B-B shown in FIG. 1.

The piezoelectric resonant element 10 has generally rectangular major surfaces on its upper and lower sides. A piezoelectric substrate 11 has a pair of oscillatory electrodes 12 and 13 stuck to both its major surfaces such that respective portions thereof are opposed to each other through the piezoelectric substrate 11.

The piezoelectric substrate 11 is a substrate in a rectangular parallelepiped shape composed of a piezoelectric ceramic material such as lead zirconate titanate or lead titanate or a piezoelectric single crystal material such as crystal or lithium niobate, and is polarized in the thickness direction. When the piezoelectric substrate 11 is composed of a ceramic material, it can have desired piezoelectric characteristics by forming the ceramic material in a sheet shape by means of a method such as a method of mixing a binder with raw powder and pressing the resulting mixture or a method of mixing water and a dispersant with raw powder using a ball mill and drying the resulting mixture and molding the mixture after adding a binder, a solvent, a plasticizer or the like thereto, then baking the sheet-shaped ceramic material at a peak temperature of 1100° C. to 1400° C. for several ten minutes to several hours to form a substrate, and subjecting the substrate to polarization processing upon application of a voltage of 3 to 15 kV/mm at a temperature of 60° C. to 150° C. in the thickness direction, for example. On the other hand, when the piezoelectric substrate 11 is composed of a piezoelectric single crystal material, it can have desired piezoelectric characteristics by cutting an ingot (a base material) of the piezoelectric single crystal material composing the piezoelectric substrate 11 such that the direction thereof is a predetermined crystal direction.

When an AC voltage is applied to the oscillatory electrodes 12 and 13 that have been stuck to such a piezoelectric resonant element 10, various vibrations are excited due to a piezoelectric effect, so that a resonant peak caused by each of the vibrations appears on frequency characteristics. The piezoelectric resonant element 10 according to the present embodiment utilizes a resonant peak caused by the vibration of a thickness-longitudinal third harmonic wave.

The oscillatory electrode 12 includes an opposing portion 12a opposed to the oscillatory electrode 13, a deriving portion 12b derived from the opposing portion 12a and provided for electrical connection to the outside, and an extending portion 12c extended from the opposing portion 12a. The oscillatory electrode 13 includes an opposing portion 13a opposed to the oscillatory electrode 12, a deriving portion 13b derived from the opposing portion 13a and provided for electrical connection to the outside, and an extending portion 13c extended from the opposing portion 13a.

Here, the extending portions 12c and 13c are respectively extended from the opposing portions 12a and 13a toward directions parallel to and opposite to the short side of the major surface of the piezoelectric substrate 11 from the center X of an opposing region between the oscillatory electrodes 12 and 13 when the piezoelectric substrate 11 is viewed from the top. The extending portions 12c and 13c are respectively provided in the oscillatory electrodes 12 and 13, so that the level of spurious in the piezoelectric resonant element 10 can be effectively reduced. This may be attributed to the fact that an unnecessary vibration existing in a nonopposing region between the oscillatory electrodes 12 and 13 is attenuated due to a mass adding effect of the extending portions 12c and 13c formed in the nonopposing region. That is, in the present embodiment, the vibration of the thickness-longitudinal third harmonic wave is utilized. This vibration is almost enclosed in the opposing region between the oscillatory electrodes 12 and 13. However, the vibration of another mode such as a fundamental wave or a fifth harmonic wave that is simultaneously generated also exists in the nonopposing region between the oscillatory electrodes 12 and 13. It is considered that the vibration of a mode other than the thickness-longitudinal third harmonic wave existing in the nonopposing region can be attenuated due to the mass adding effect of the extending portions 12c and 13c formed therein, which allows the level of spurious caused thereby to be reduced.

The inventors of the present invention have done simulation using a finite element method, to analyze a vibration distribution of a vibration causing spurious generated at a frequency in the vicinity of a resonant peak caused by the vibration of the thickness-longitudinal third harmonic wave. As a result, they found out that a region where the amplitude of the vibration causing the spurious is great exists in a portion projected from the opposing region between the oscillatory electrodes 12 and 13 toward a direction parallel to the short side of the major surface of the piezoelectric substrate 11 from the center X of the opposing region between the oscillatory electrodes 12 and 13. This proves that the level of the spurious can be particularly effectively reduced by forming the extending portions 12c and 13c in the portions projected from the opposing region between the oscillatory electrodes 12 and 13.

Furthermore, a capacitance between the oscillatory electrodes 12 and 13 in a case where the extending portions 12c and 13c are formed can be made larger, as compared with a case where the extending portions 12c and 13c are not formed. Thus, a higher-order thickness-longitudinal vibration mode and particularly a thickness-longitudinal fifth harmonic wave is attenuated, which allows the level of spurious caused thereby to be reduced. There is also a method of increasing the area of the opposing region between the oscillatory electrodes 12 and 13 in order to increase the capacitance between the oscillatory electrodes 12 and 13. However, the increase in the area of the opposing region is not preferable because it brings about increase in an unnecessary vibration causing spurious. Furthermore, the deriving portions 12b and 13b also bring about increase in capacitance between the oscillatory electrodes 12 and 13, to which there is however also a limit. In the piezoelectric resonant element 10 according to the present invention, by forming the extending portions 12c and 13c, the capacitance between the oscillatory electrodes 12 and 13 can be increased without increasing the area of the opposing region between the oscillatory electrodes 12 and 13. Therefore, it is possible to reduce the level of spurious caused by the higher-order thickness-longitudinal vibration mode and particularly the fifth harmonic wave of thickness-longitudinal vibration.

It is preferable that the extending portions 12c and 13c are linearly symmetrical with respect to a straight line (a line C-C in FIG. 2 (a)) passing through the center X of the opposing region between the oscillatory electrodes 12 and 13 and parallel to the long side of the major surface of the piezoelectric substrate 11 when the piezoelectric substrate 11 is viewed from the top. In this case, a mass distribution and an electric field distribution of the electrodes around the center of the vibration of the thickness-longitudinal third harmonic wave that is existing in the opposing region between the oscillatory electrodes 12 and 13 can effectively reduce an adverse affect to the vibration of the thickness-longitudinal third harmonic wave.

Furthermore, it is preferable that the extending portions 12c and 13c are linearly symmetrical with respect to a straight line (a line D-D in FIG. 2 (a)) passing through the center X of the opposing region between the oscillatory electrodes 12 and 13 and parallel to the short side of the major surface of the piezoelectric substrate 11 when the piezoelectric substrate 11 is viewed from the top. To form the extending portions 12c and 13c in such a shape can more effectively prevent the vibration of the thickness-longitudinal third harmonic wave from being adversely affected.

As a material for the oscillatory electrodes 12 and 13, metals having good conductive properties such as gold, silver, copper, chromium, nickel, tin, lead, and aluminum are used. The metals are formed by means of coating, baking and the like using PVD such as vacuum evaporation, or sputtering, or thick film printing, conventionally well-known.

Other embodiments of the present invention will be then described with reference to FIGS. 3 to 7. In the embodiments, only differences from the above-mentioned embodiment shall be described to omit the overlapped description by using the same reference numerals for the same constituent elements.

Figure 3:
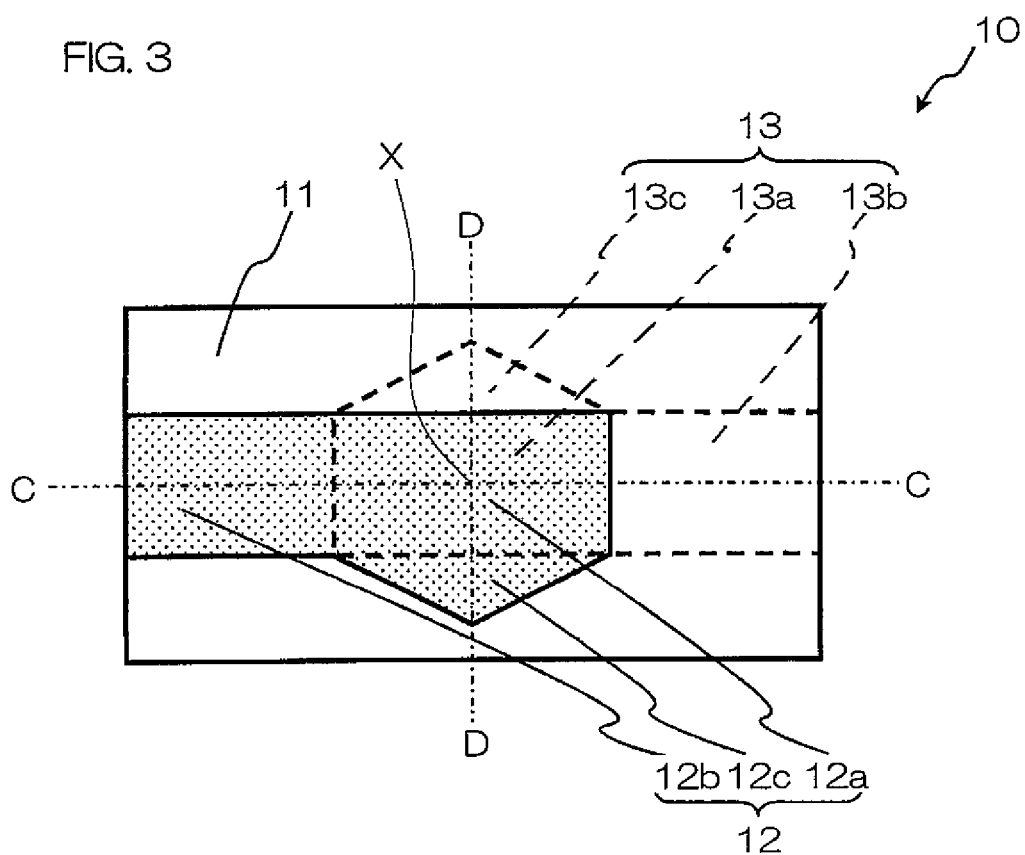
FIG. 3 is a plan view schematically showing a piezoelectric resonant element according to another embodiment of the present invention.
Figure 4:
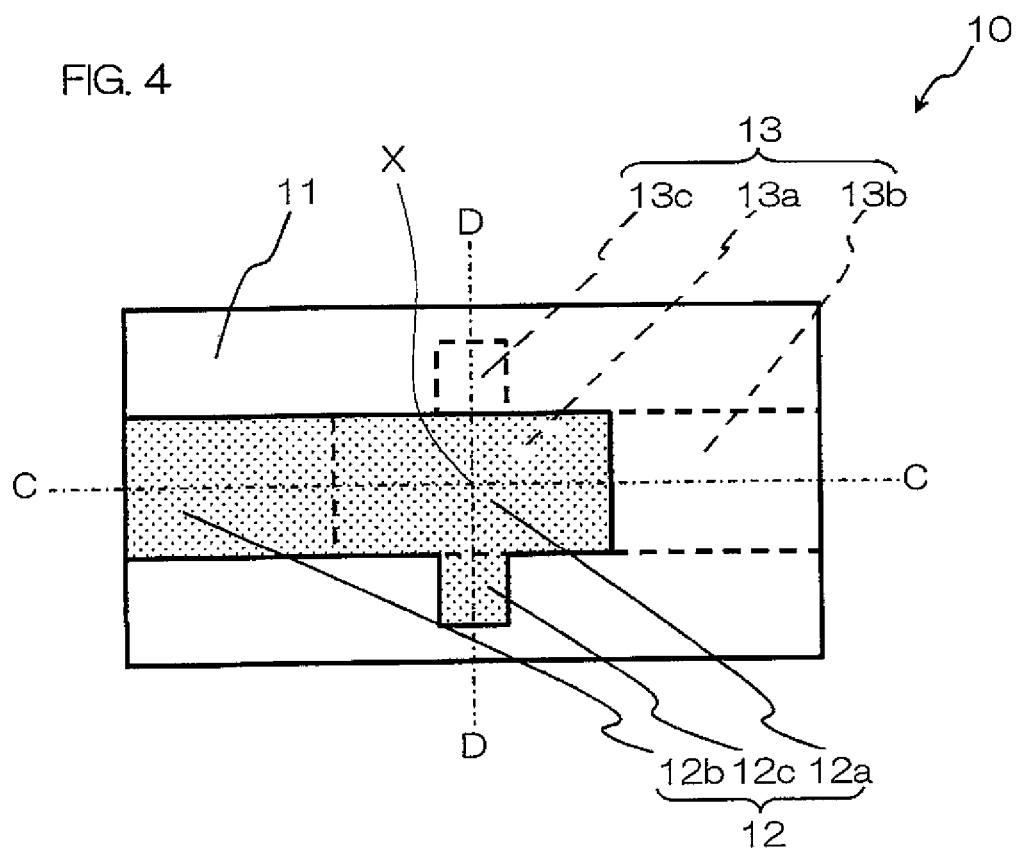
FIG. 4 is a plan view schematically showing a piezoelectric resonant element according to still another embodiment of the present invention.

FIGS. 3 and 4 are plan views of piezoelectric resonant elements, each showing an example of an oscillatory electrode pattern in which the shape of extending portions is changed.

A region where the amplitude of a vibration causing spurious generated at a frequency in the vicinity of a resonant peak caused by the vibration of a thickness-longitudinal third harmonic wave is great exists in extending portions 12c and 13c projected from an opposing region between oscillatory electrodes 12 and 13 toward a direction parallel to the short side of a major surface of a piezoelectric substrate 11 from the center X of the opposing region between the oscillatory electrodes 12 and 13.

The shapes of the extending portions 12c and 13c are respectively triangles whose bases are one sides, parallel to the long side of the major surface of the piezoelectric substrate 11, of opposing portions 12a and 13a in the case shown in FIG. 3, or are respectively rectangles extending from parts of one sides, parallel to the long side of the major surface of the piezoelectric substrate 11, of opposing portions 12a and 13a in the case shown in FIG. 4. The extending portions 12c and 13c in such a shape also allow the level of the spurious to be suppressed.

Figure 5:
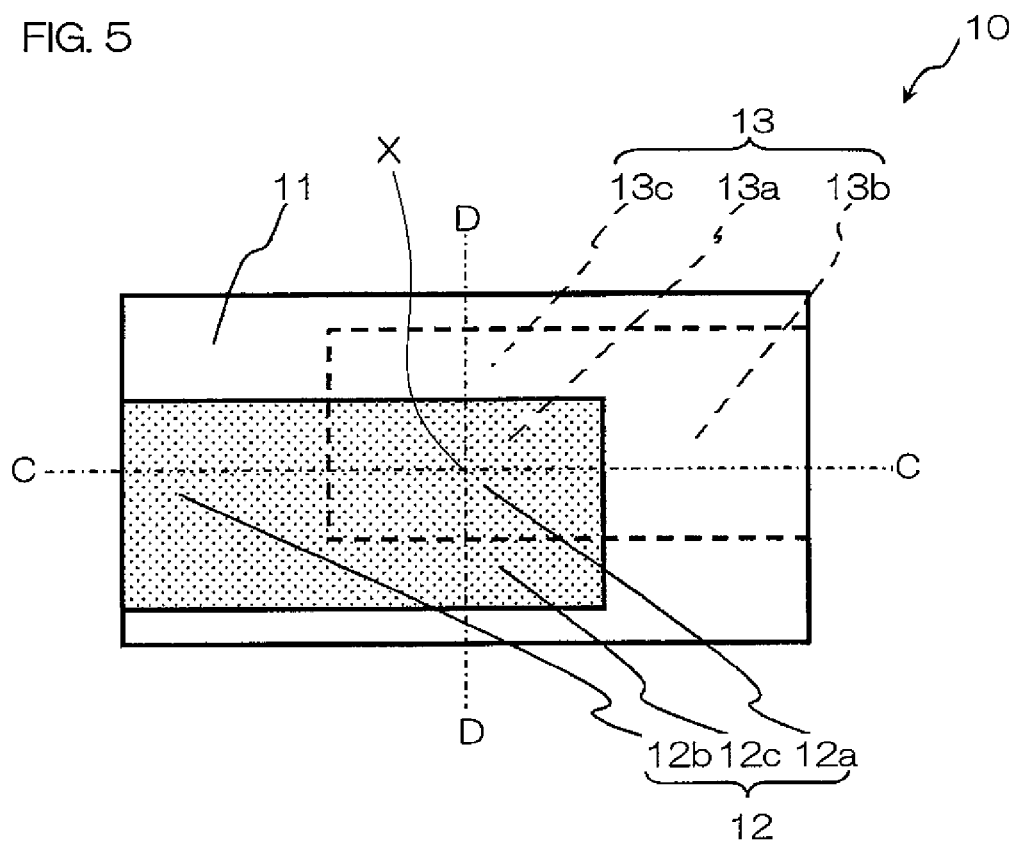
FIG. 5 is a plan view schematically showing a piezoelectric resonant element according to still another embodiment of the present invention.

FIG. 5 is a plan view of a piezoelectric resonant element, showing an example in which the respective widths of deriving portions 12b and 13b are respectively enlarged to the extending portions 12c and 13c.

In the oscillatory electrodes 12 and 13 in the shape shown in FIG. 5, a capacitance between the oscillatory electrodes 12 and 13 is further increased. Therefore, a higher-order thickness-longitudinal vibration mode and particularly a fifth harmonic wave of thickness-longitudinal vibration is further attenuated, which allows the level of spurious caused thereby to be further reduced.

Figure 6:
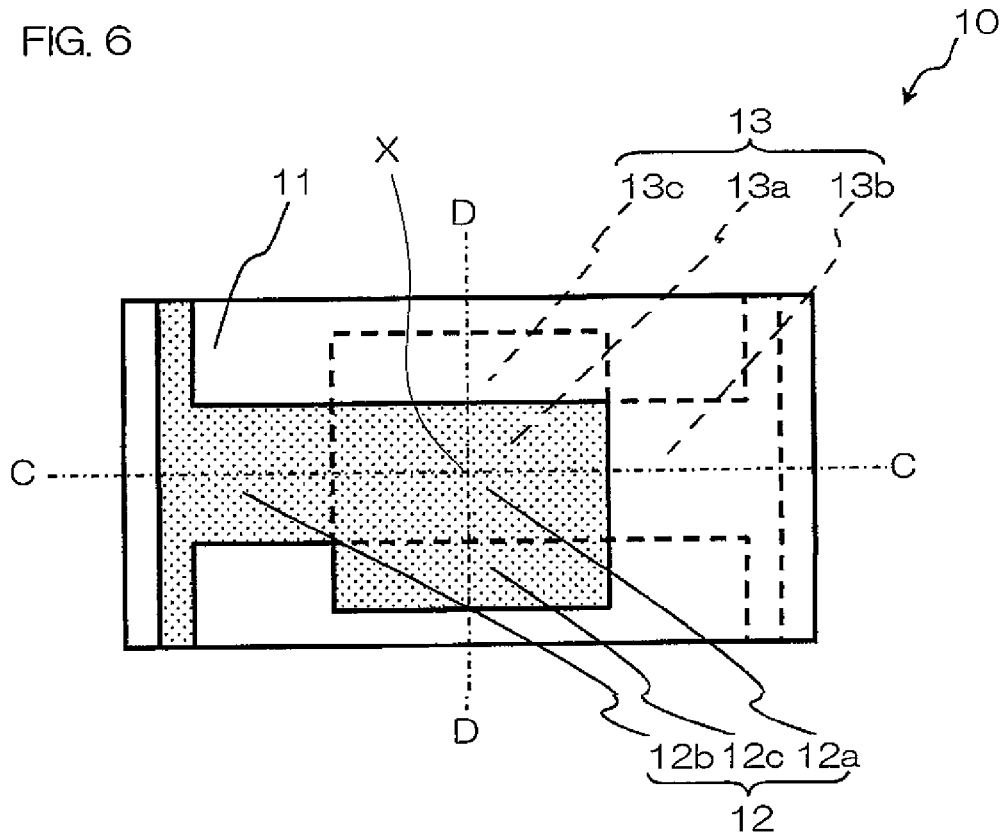
FIG. 6 is a plan view schematically showing a piezoelectric resonant element according to still another embodiment of the present invention.
Figure 7:
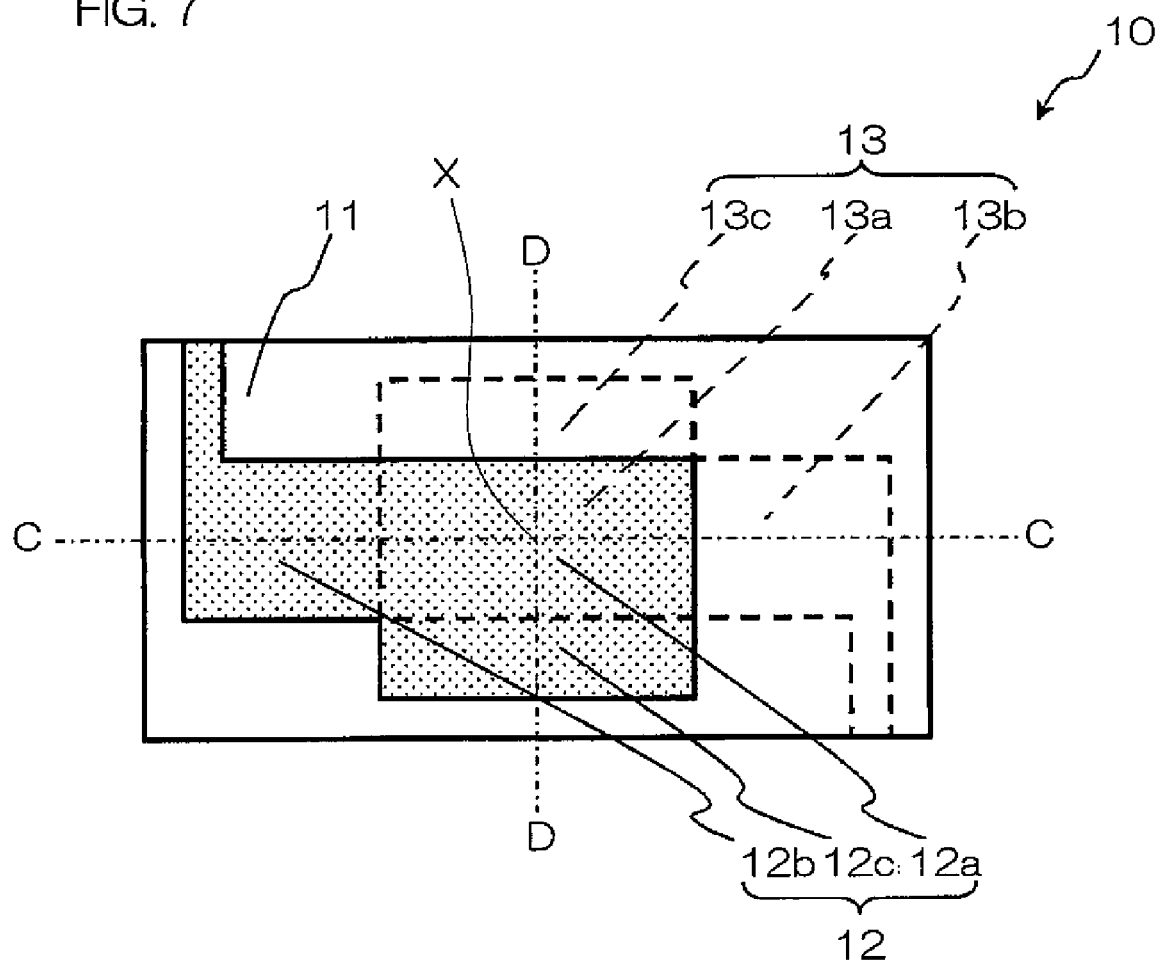
FIG. 7 is a plan view schematically showing a piezoelectric resonant element according to still another embodiment of the present invention.

Furthermore, FIGS. 6 and 7 are plan views of piezoelectric resonant elements, each showing an example of an oscillatory electrode pattern in which the shapes of deriving portions 12b and 13b are changed.

As shown in the drawings, the deriving portions 12b and 13c need not necessarily be derived to the short side of a major surface of a piezoelectric substrate 11. Alternatively, the deriving portions may be derived to the long side thereof by respectively changing the directions thereof from halfway.

Figure 8:
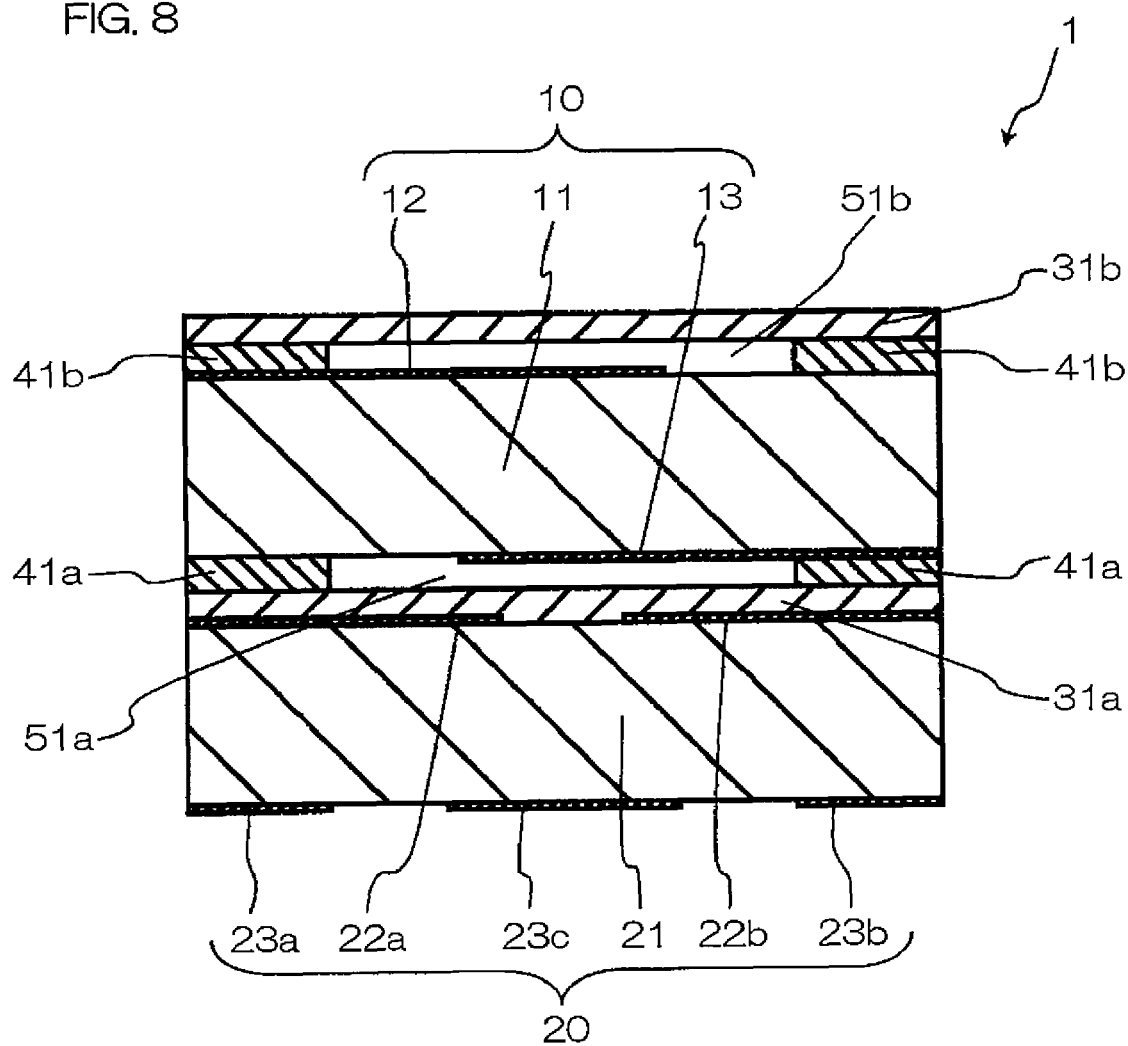
FIG. 8 is a vertical sectional view schematically showing a piezoelectric resonator according to an embodiment of the present invention.
Figure 9:
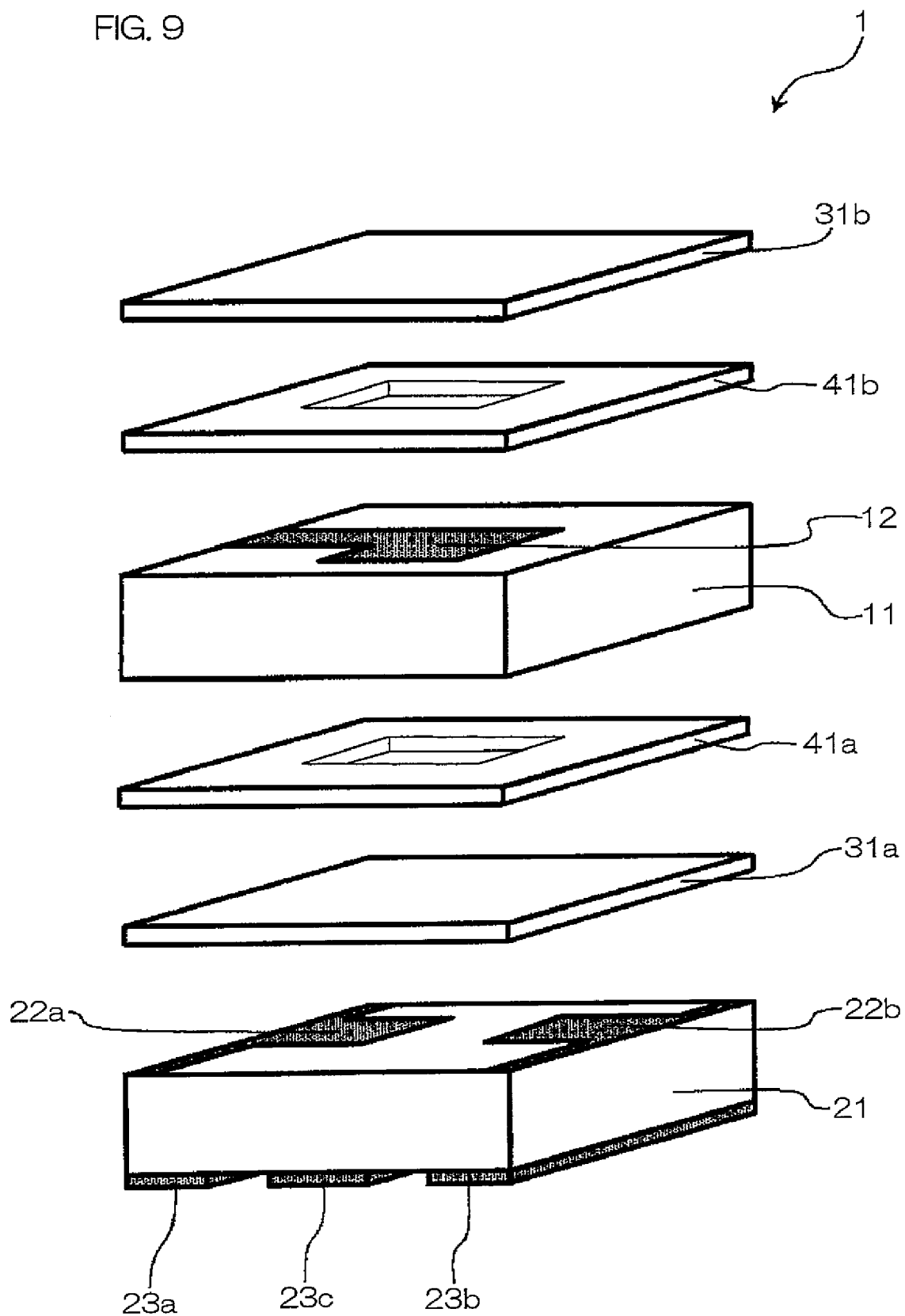
FIG. 9 is an exploded perspective view schematically showing the piezoelectric resonator shown in FIG. 8.
Figure 10:
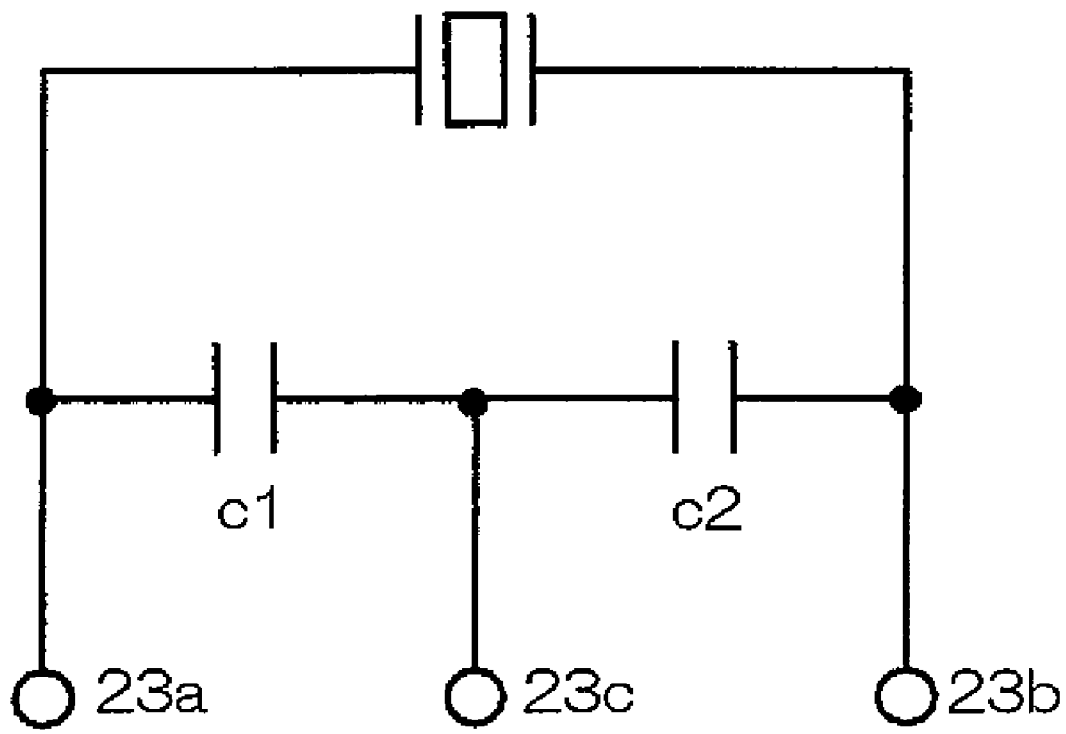
FIG. 10 is an equivalent circuit diagram of the piezoelectric resonator shown in FIG. 8.

Furthermore, FIG. 8 is a vertical sectional view schematically showing a piezoelectric resonator 1 in which the above-mentioned piezoelectric resonant element 10 and a capacitor element 20 are electrically and mechanically connected to each other to constitute a capacitance built-in type piezoelectric resonator, FIG. 9 is an exploded perspective view of the piezoelectric resonator shown in FIG. 8, and FIG. 10 is a diagram of its equivalent circuit.

The piezoelectric resonator 1 shown in the drawings is mainly composed of the piezoelectric resonant element 10 and the capacitor element 20.

A sealing substrate 31b is joined to an upper surface of the piezoelectric resonant element 10 through a frame 41b such that an oscillatory space 51b is formed, and a sealing substrate 31a is joined to a lower surface of the piezoelectric resonator 10 through a frame 41a such that an oscillatory space 51a is formed.

On the other hand, the capacitor element 20 includes a dielectric substrate 21, an internal electrode 22 (22a, 22b), and an external terminal electrode 23 (23a, 23b, 23c). Specifically, the internal electrodes 22a and 22b and the external terminal electrodes 23a, 23b, and 23c are respectively formed on an upper surface and a lower surface of the dielectric substrate 21. The external terminal electrodes 23a, 23b, and 23c are arranged such that predetermined capacitances are respectively formed between the external terminal electrodes 23a and 23c and between the external terminal electrodes 23b and 23c.

The dielectric substrate 21 is a substrate in the shape of a square composed of a ferroelectric ceramic material such as lead zirconate titanate (PZT) lead titanate (PT), or barium titanate (BT). The dielectric substrate 21 is formed by producing a sheet by means of a method such as a method of mixing a binder with raw powder and pressing the resulting mixture or a method of mixing water and a dispersant with raw powder using a ball mill and drying the resulting mixture and molding the mixture after adding a binder, a solvent, a plasticizer, or the like thereto using doctor blading, and then baking the produced sheet at a peak temperature of 1100° C. to 1400° C. for several ten minutes to several hours.

The internal electrode 22 and the external terminal electrode 23 that are respectively formed on the upper and lower surfaces of the dielectric substrate 21 are formed of the same material and by the same method as those for the oscillatory electrodes 12 and 13, and a surface of the external terminal electrode 23 is further nickel-plated and tin-plated.

The sealing substrate 31 (31a, 31b), together with the frame 41 (41a, 41b), has the function of forming the oscillatory space 51 (51a, 51b) to protect an oscillatory region of the piezoelectric substrate 11. The length and the width of the sealing substrate 31 are generally the same as the length and the width of the piezoelectric substrate 11. The thickness of the sealing substrate 31 is set to several ten micrometers to several millimeters, for example, although it differs depending on a material therefor. As the material for the sealing substrate 31, engineering plastic such as polybutylene terephthalate (PBT) and heat-resistant resin such as liquid crystal polymer and epoxy resin can be used. Particularly, polyimide resin and epoxy resin having a glass fiber content of 30 to 80% are suitably used. In this case, the sealing substrate 31 can be satisfactorily joined when held and cured at a temperature of 180° C. to 200° C. for 40 to 90 minutes with a pressure of 0.2 MPa to 5 MPa applied thereto in a vacuum of not more than 100 Pa.

The frame 41, together with the sealing substrate 31, has the function of forming the oscillatory space 51, is composed of thermosetting resin such as epoxy resin, and is formed, for example, by applying the thermosetting resin to the piezoelectric substrate 11 using the conventionally well-known thick film printing, followed by drying and curing at a temperature of 80° C. to 200° C. Furthermore, in order to adjust the viscosity and the coefficient of thermal expansion of the frame 41, the frame 41 may contain a filler composed of an inorganic material such as silicon oxide.

Here, it is desirable that the frame 41 is not brought into contact with the opposing portions 12a and 13a in the oscillatory electrodes but brought into contact with the extending portions 12c and 13c in the oscillatory electrodes. This allows a vibration causing spurious to be further suppressed almost without affecting the vibration of a thickness-longitudinal third harmonic wave enclosed in the opposing portions in the oscillatory electrodes 12 and 13.

The piezoelectric resonant element 10 and the capacitor element 20 are electrically connected to each other by an external connection electrode (not shown) The external connection electrode is formed, for example, by applying conductive epoxy resin to respective side surfaces of the piezoelectric substrate 11 and the dielectric substrate 21 by means of the conventionally well-known thick film printing or the like, followed by heating and curing at a temperature of 80° C. to 250° C.

In the above-mentioned piezoelectric resonator, the oscillatory electrode 12, the internal electrode 22a, and the external terminal electrode 23a are connected to one another by the external connection electrode, and the oscillatory electrode 13, the internal electrode 22b, and the external terminal electrode 23b are connected to one another by the other external connection electrode.

The piezoelectric resonant element 10, a capacitance c1 formed between the external terminal electrodes 23a and 23c, and a capacitance c2 formed between the external terminal electrodes 23b and 23c constitute the capacitance built-in type piezoelectric resonator shown in the equivalent circuit diagram of FIG. 10.

Since the piezoelectric resonator 1 includes the piezoelectric resonant element 10 in which spurious is effectively suppressed and the capacitance element 20 electrically connected to the oscillatory electrodes thereof, the piezoelectric resonator 1 has excellent characteristics in which its oscillatory frequency is hardly shifted.

EXAMPLES

In order to confirm the function and the effect of the present invention, a capacitance built-in type piezoelectric resonator shown in FIGS. 8 to 10 was experimentally manufactured, to measure the electrical characteristics thereof.

A piezoelectric substrate 11 was made of lead titanate, had a shape measuring 2.5 mm in length by 2.0 mm in width by 0.31 mm in thickness, and had oscillatory electrodes 12 and 13 composed of chromium serving as a base and silver and formed by sputtering on its upper and lower surfaces. As the shape of the oscillatory electrodes, oscillatory portions 12a and 13a each had a shape measuring 0.6 mm in length by 0.5 mm in width, deriving portions 12b and 13b each had a shape measuring 0.95 mm in length by 0.5 mm in width, and extending portions 12c and 13c each had a shape measuring 0.6 mm in length by 0.45 mm in width.

Furthermore, a dielectric substrate 21 was made of barium titanate, had a shape measuring 2.5 mm in length by 2.0 mm in width by 0.16 mm in thickness, and had an internal electrode 22 and an external terminal electrode 23 formed by applying and baking a conductive past mainly composed of silver on its upper and lower surfaces. A surface of the external terminal electrode 23 was further nickel-plated and tin-plated.

A frame 41 was formed by applying and curing epoxy resin on upper and lower surfaces of a piezoelectric resonant element 10, and was then sandwiched from above and below by sealing substrates 31 composed of glass fiber-contained polyimide resin. Furthermore, a capacitor element 20 was also overlapped therewith from below, was held, cured and joined at a temperature of 180° C. for sixty minutes with a pressure of 0.5 MPa applied in a vacuum of 100 Pa. Thereafter, external connection electrodes were respectively formed by applying and curing a conductive paste mainly composed of silver on side surfaces of the piezoelectric substrate 11 and the dielectric substrate 21, to manufacture a piezoelectric resonator 1.

For comparison, another piezoelectric resonator was manufactured in the same manner as that in the above-mentioned example except that the extending portions 12c and 13c were not formed.

Figure 11:
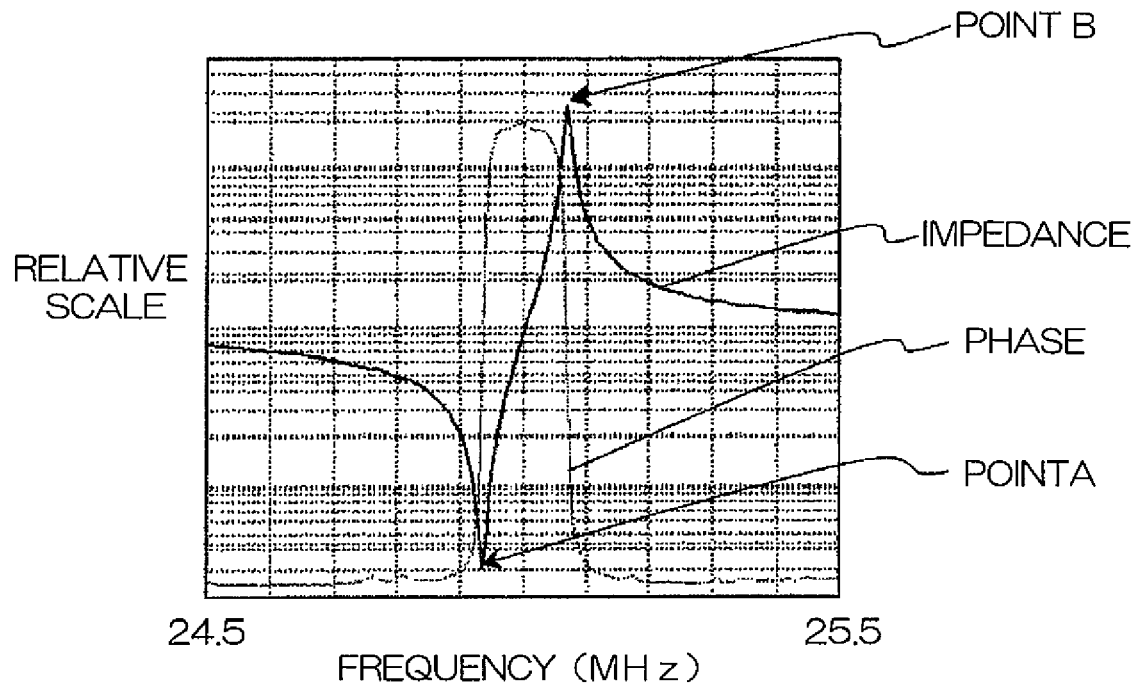
FIG. 11 is graphs showing the electrical characteristics of the piezoelectric resonator, where FIG. 11 (a) is a graph showing the electrical characteristics of the piezoelectric resonator according to the present invention, and FIG. 11 (b) is a graph showing the electrical characteristics of a conventional piezoelectric resonator.
Figure 11:
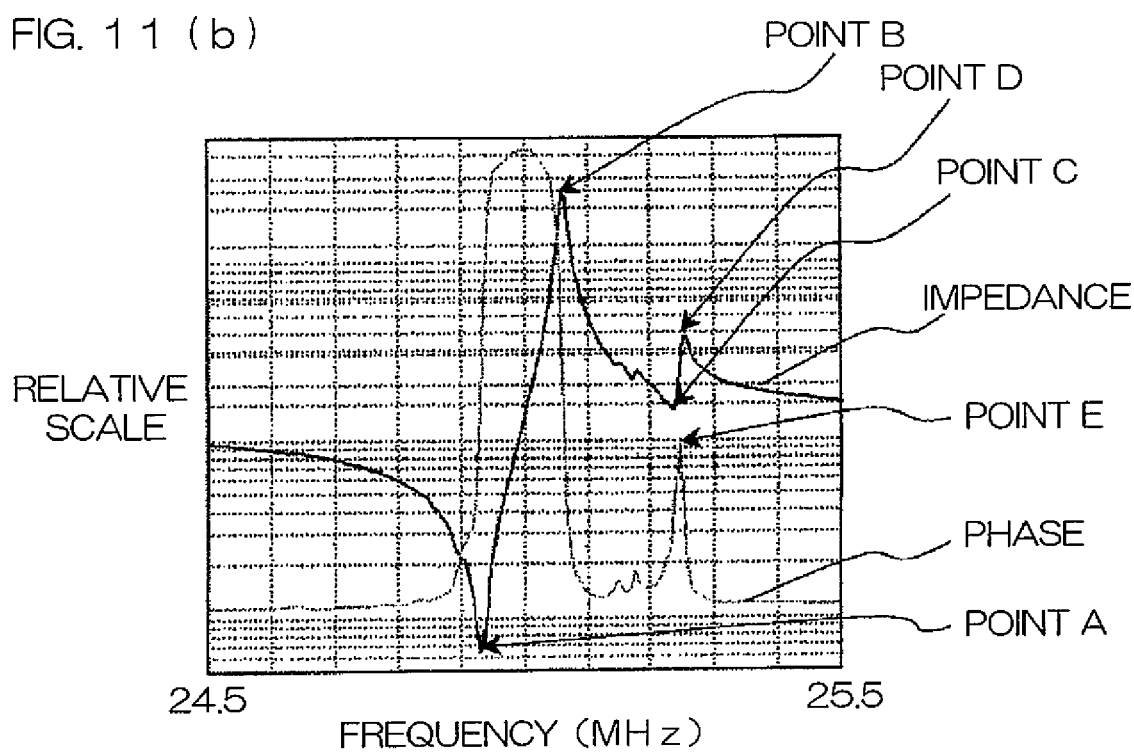

FIG. 11 (a) is a graph showing the electrical characteristics of the piezoelectric resonator 1 according to the present invention manufactured in the foregoing manner. FIG. 11 (b) is a graph showing the electrical characteristics of the comparative example. In each of the graphs, the horizontal axis indicates frequency (MHz), and the vertical axis indicates impedance (a solid line) and phase shift amount (a broken line). A scale in the vertical axis is taken as a relative scale.

As can be seen from comparison between FIG. 11 (a) and FIG. 11 (b), the piezoelectric resonator according to the present invention had good electrical characteristics because a spurious peak (points C and D in impedance characteristics and a point E in phase characteristics) existing on the slightly higher frequency side than a resonant peak (points A and B in impedance characteristics) caused by the vibration of a thickness-longitudinal third harmonic wave was suppressed.

Furthermore, the area of the extending portions 12c and 13c was gradually increased to gradually increase a capacitance between the oscillatory electrodes 12 and 13, to evaluate in each of them the level of the resonant peak caused by the vibration of the thickness-longitudinal third harmonic wave and the level of a resonant peak caused by the vibration of a thickness-longitudinal fifth harmonic wave to be spurious and examine the change in the difference therebetween.

In the evaluation of the level of the resonant peak, a resistance value $R_0$ at a resonance point (the point A in FIG. 11) and a resistance value Ra at an anti-resonance point (the point B in FIG. 11) were measured, and a P/V value defined by a P/V value=20 Log (Ra/$R_0$) was used. The results are shown in FIG. 12.

Figure 12:
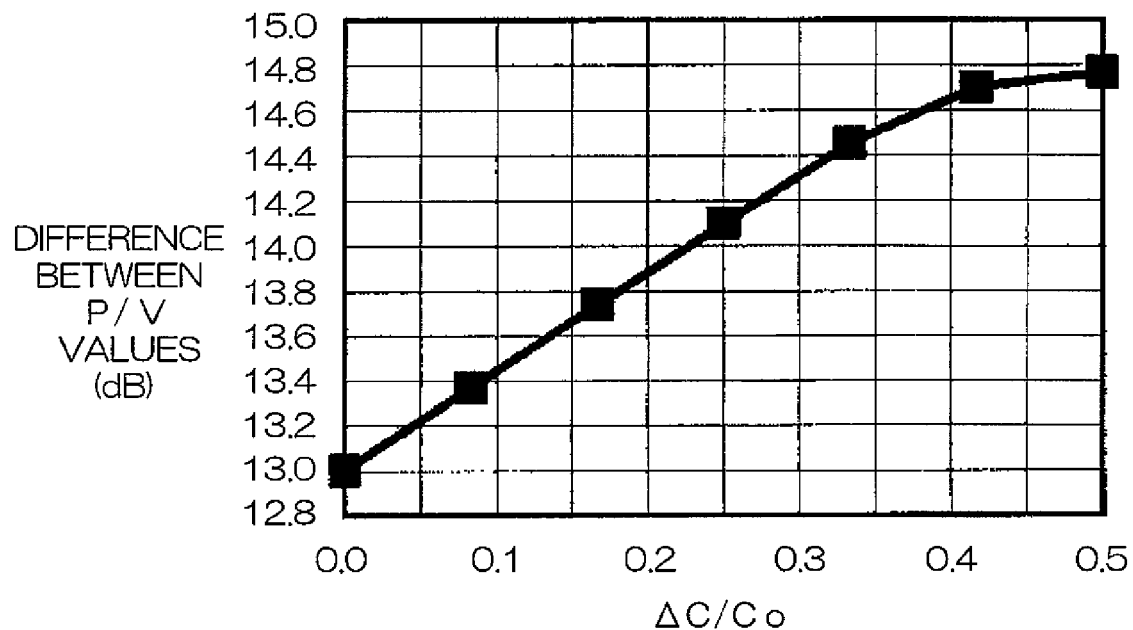
FIG. 12 is a graph showing the change in level difference between a resonant peak caused by the vibration of a thickness-longitudinal third harmonic wave and a resonant peak caused by the vibration of a thickness-longitudinal fifth harmonic wave due to the change in capacitance between oscillatory electrodes 12c and 13c.
Figure 13:
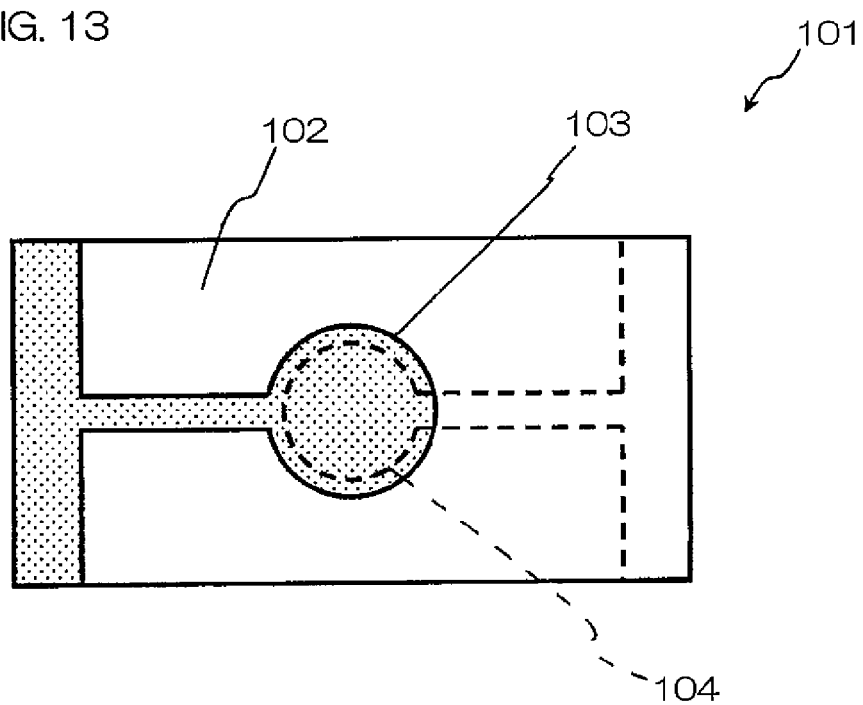
FIG. 13 is a plan view schematically showing a conventional piezoelectric resonant element.

In the graph shown in FIG. 12, the horizontal axis indicates a capacitance $\Delta C$ newly added by the extending portions 12c and 13c divided by a capacitance $C_0$ between the oscillatory electrodes 12 and 13 where the extending portions 12c and 13c have not been formed, and the vertical axis indicates a difference obtained by subtracting a P/V value in the resonant peak caused by the vibration of the thickness-longitudinal fifth harmonic wave from the P/V value in the resonant peak caused by the vibration of the thickness-longitudinal third harmonic wave.

Here, in the piezoelectric resonator 1 utilizing the vibration of the thickness-longitudinal third harmonic wave, it is desirable that the resonant peak caused by the vibration of the thickness-longitudinal fifth harmonic wave to be spurious is smaller than the resonant peak caused by the vibration of the thickness-longitudinal third harmonic wave. Particularly, it is preferable that the difference therebetween is set to not less than 14 dB, and the value of $\Delta C/C_0$ is set to not less than 0.25. Thus, it was confirmed that the level of the resonant peak caused by a higher-order thickness-longitudinal vibration mode and particularly the vibration of the thickness-longitudinal fifth harmonic wave was kept low by forming the extending portions 12c and 13c to increase the capacitance between the oscillatory electrodes 12 and 13.

In this experiment, a slight decrease was produced in the P/V value at the resonant peak caused by the vibration of the thickness-longitudinal third harmonic wave by the increase in the value $\Delta C/C_0$, which, however, the decrease in the P/V value at the resonant peak caused by the vibration of the thickness-longitudinal fifth harmonic wave exceeded. Therefore, it was also confirmed that a level difference therebetween was increased, resulting in good electrical characteristics.

The present invention is not limited to the foregoing examples. Various modifications and improvements are possible without departing from the scope of the present invention.

Although in the above-mentioned embodiment, description was made of the example in which the extending portions 12c and 13c are linearly symmetrical with respect to the straight line (the line C-C in FIG. 2 (a)) passing through the center X of the opposing region between the oscillatory electrodes 12 and 13 and parallel to the long side of the major surface of the piezoelectric substrate 11 as a center line when the piezoelectric substrate 11 is viewed from the top, for example, the extending portions need not necessarily be so arranged. Spurious can be effectively suppressed, as long as in the nonopposing region between the oscillatory electrodes, the extending portions 12c and 13c that are extended in the directions perpendicular to the above-mentioned one side and opposite to each other outward from the center X of the opposing region are provided.

Although in the above-mentioned embodiment, description was made of the example in which the extending portions 12c and 13c are linearly symmetrical with respect to the straight line (the line D-D in FIG. 2 (a)) passing through the center X of the opposing region between the oscillatory electrodes 12 and 13 and parallel to the short side of the major surface of the piezoelectric substrate 11 as a center line when the piezoelectric substrate 11 is viewed from the top, the extending portions need not necessarily be so arranged. Spurious can be effectively suppressed, as long as in the nonopposing region between the oscillatory electrodes, the extending portions 12c and 13c that are extended in the directions perpendicular to the above-mentioned one side and opposite to each other outward from the center X of the opposing region are provided.

The invention claimed is:

1. A piezoelectric resonant element having a pair of oscillatory electrodes stuck to both major surfaces of a rectangular piezoelectric substrate, wherein the pair of oscillatory electrodes includes opposing portions that are opposed to each other through the piezoelectric substrate, deriving portions that are derived from the opposing portions in directions parallel to one side surface of the piezoelectric substrate, and extending portions that are extended in directions perpendicular to the one side surface, and the deriving portion derived from the opposing portion in the one oscillatory electrode and the deriving portion derived from the opposing portion in the other oscillatory electrode are derived in opposite directions, and the extending portion extended from the opposing portion in the one oscillatory electrode and the extending portion extended from the opposing portion in the other oscillatory electrode are extended in opposite directions.

2. The piezoelectric resonant element according to claim 1, wherein one extending portion and the other extending portion in the pair of oscillatory electrodes are linearly symmetrical with respect to a straight line passing through the respective centers of the opposing portions and parallel to the one side surface when the piezoelectric substrate is viewed from a top.

3. A piezoelectric resonator comprising the piezoelectric resonant element according to claim 1 and a capacitor element electrically connected to the oscillatory electrode of the piezoelectric resonant element.

4. The piezoelectric resonator according to claim 3, wherein the capacitor element includes a dielectric substrate, an internal electrode formed on one major surface of the dielectric substrate, and an external terminal electrode formed on the other major surface of the dielectric substrate.

5. The piezoelectric resonator according to claim 3, further comprising a frame attached to the major surface of the piezoelectric substrate and a sealing substrate attached to the frame.

6. The piezoelectric resonator according to claim 5, wherein the frame is in contact with the extending portion in the oscillatory electrode.

* * * * *